(12) United States Patent
Niuya

(10) Patent No.: US 6,214,658 B1
(45) Date of Patent: *Apr. 10, 2001

(54) SELF-ALIGNED CONTACT STRUCTURE AND METHOD

(75) Inventor: Takayuki Niuya, Plano, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/987,507

(22) Filed: Dec. 9, 1997

Related U.S. Application Data

(60) Provisional application No. 60/032,803, filed on Dec. 9, 1996.

(51) Int. Cl.[7] ............................................. H01L 21/8238
(52) U.S. Cl. ................................. 438/233; 438/659
(58) Field of Search .................................. 257/211, 503, 257/758, 648, FOR 196, 349, 359; 438/453, 523, 533, 659, 517, 634, 233, 275

(56) References Cited

U.S. PATENT DOCUMENTS

| | | | |
|---|---|---|---|
| 4,966,868 | * 10/1990 | Murali et al. | 438/233 |
| 5,006,911 | * 4/1991 | Sivan | 257/346 |
| 5,227,319 | 7/1993 | Ogura et al. | 438/128 |
| 5,242,847 | * 9/1993 | Ozturk et al. | 438/300 |
| 5,395,787 | * 3/1995 | Lee et al. | 438/228 |
| 5,413,957 | * 5/1995 | Byun | 438/302 |
| 5,432,105 | * 7/1995 | Chien | 438/228 |
| 5,510,296 | * 4/1996 | Yen et al. | 438/533 |
| 5,554,864 | * 9/1996 | Koyama | 257/211 |
| 5,571,735 | * 11/1996 | Mogami et al. | 438/533 |
| 5,594,270 | * 1/1997 | Hiramoto et al. | 257/503 |
| 5,718,800 | * 2/1998 | Juengling | 438/233 |
| 5,721,146 | * 2/1998 | Liaw et al. | 438/533 |
| 5,807,769 | * 9/1998 | Dennison et al. | 438/300 |
| 5,834,851 | * 11/1998 | Ikeda et al. | 257/211 |

FOREIGN PATENT DOCUMENTS

| | | |
|---|---|---|
| 0 302 383 | 2/1989 | (EP) . |
| 0 645 820 | 3/1995 | (EP) . |
| 0 738 005 | 10/1996 | (EP) . |
| 62 291176 | 12/1987 | (JP) . |
| 7-263567 | 10/1995 | (JP) . |

* cited by examiner

Primary Examiner—Long Pham
Assistant Examiner—William David Coleman
(74) Attorney, Agent, or Firm—Jacqueline J. Garner; W. James Brady, III; Frederick J. Telecky, Jr.

(57) ABSTRACT

A semiconductor device (2) includes gates (20, 22, 24, 26), source/drain regions (40, 42, 44, 46), and self-aligned contacts (80, 82, 84, 86). Each self-aligned contact (80, 82, 84, 86) includes a polysilicon layer (50) overlying the associated source/drain region (40, 42, 44, 46). The polysilicon layer (50) may include different doped regions (52, 58) in accordance with the design and function of the device (2).

11 Claims, 6 Drawing Sheets

SELF-ALIGNED CONTACT STRUCTURE AND METHOD

This application claims priority under 35 USC §119(e)(1) of provisional application No. 60/032,803 filed Dec. 9, 1996.

TECHNICAL FIELD OF THE INVENTION

This invention relates in general to semiconductor fabrication, and more specifically to a self-aligned contact structure and method.

BACKGROUND OF THE INVENTION

Semiconductor device fabrication involves the forming of different components on a substrate using a variety of techniques, such as deposition, patterning, and etching. One component in semiconductor devices is a contact for coupling a layer of material to the underlying substrate or another layer. Depending on the particular application and the desired function, contacts may be holes, vias, channels or other geometric structures.

Efforts to miniaturize the components in a semiconductor device have begun to challenge the tolerance levels of the fabrication equipment. Several efforts attempt to further reduce the layout area of a semiconductor device using the same critical dimension dictated by the tolerances of the fabrication equipment. Existing techniques may offer some space savings by using traditional self-alignment techniques, but fail to accommodate a variety of different semiconductor devices and processes.

SUMMARY OF THE INVENTION

The disadvantages and problems associated with prior self-aligned contacts have been substantially reduced or eliminated by a self-aligned contact structure and method with enhanced flexibility and adaptability to accommodate a variety of fabrication techniques, such as complementary metal oxide semiconductor (CMOS) techniques.

In accordance with one embodiment of the present invention, a method is disclosed for forming a contact to a substrate, where the contact is disposed between two gates. The substrate between the gates is doped to form a source/drain region. A polysilicon layer overlying the source/drain region is formed. The polysilicon layer and the source/drain region are doped.

Technical advantages of the present invention include a self-aligned contact structure and method adapted to a variety of fabrication techniques, such as CMOS. Specifically, the self-aligned contact incorporates a non-doped polysilicon layer overlying the gates and the source/drain regions in a semiconductor device. The polysilicon layer may be doped as n-type, p-type, or other appropriate doping to support CMOS fabrication techniques and to offer enhanced flexibility and adaptability of the self-aligned contact. This structure greatly reduces alignment margin and increases the layout area of the semiconductor device using the same critical dimensions dictated by the fabrication equipment. Moreover, the polysilicon layer acts as a buffer during ion implantation, which reduces the depth of the source/drain region to improve peripheral isolation. Other technical advantages are apparent to one skilled in the art in view of the attached description, drawings, and claims.

BRIEF DESCRIPTION OF THE DRAWINGS

For a more complete understanding of the present invention, and for further features and advantages, reference is now made to the following description taken in conjunction with the accompanying drawings, in which.

DETAILED DESCRIPTION OF THE INVENTION

FIGS. 1A–1G illustrate process steps for forming a semiconductor device 2 that incorporates gates, source/drain regions, and self-aligned contacts in accordance with the present invention. The contacts may be holes, channels, vias, lines or other structures that couple a layer of material to the underlying substrate or another layer. Device 2 represents any portion of a semiconductor device, such as a memory, microprocessor, controller, logic array, or other semiconductor device. For example, device 2 may be an inverter incorporated into a dynamic random access memory (DRAM). The present invention contemplates any structure or component in a semiconductor device that incorporates a self-aligned contact to a source/drain region.

Figure 1A:
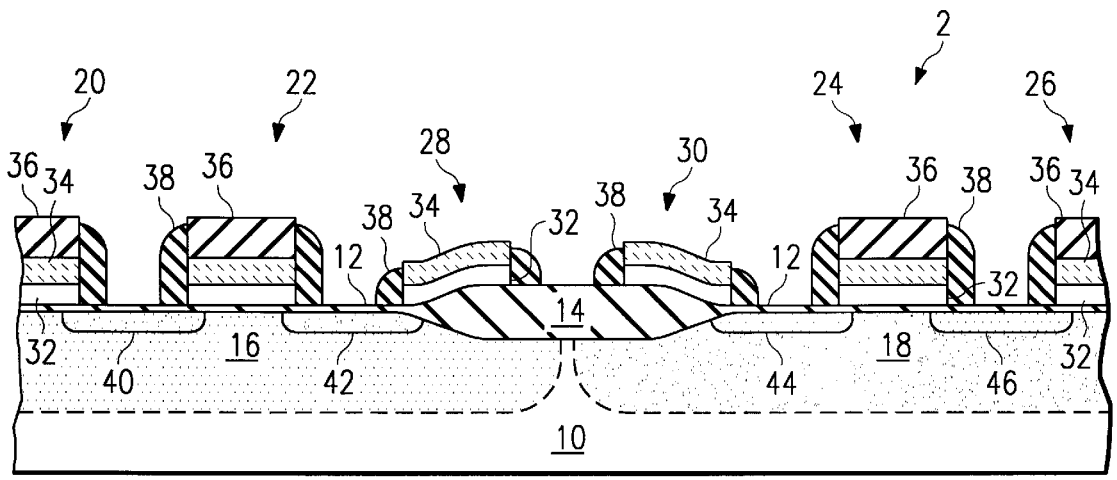
FIGS. 1A–1G illustrate process steps for forming a self-aligned contact.

FIG. 1A illustrates a starting structure that represents a number of previous process steps. An oxide layer 12 overlies a substrate 10 and includes a field oxide 14. Field oxide 14 may be formed by patterning a nitride layer, and growing field oxide 14 in areas where the nitride layer is not present. After forming field oxide 14, device 2 undergoes ion bombardment or implantation to form tanks 16 and 18 in successive patterning and bombardment steps. For example, the process may include selective boron ion bombardment to form a p-type tank 16 and selective phosphorous ion bombardment to form an n-type tank 18. Selective ion bombardment or implantation may include patterning, masking, and stripping of a resist, or other suitable photolithographic processes.

Next, the process forms gates 20, 22, 24, and 26 (referred to generally as gates 20) and contact gate structures 28 and 30 (referred to generally as contact gate structures 28). A polysilicon layer 32, a conductive layer 34, and a stopping layer 36 are deposited, patterned, and etched to form gates 20 and contact gate structures 28. Sidewalls 38 on gates 20 and contact gate structures 28 are formed by depositing and etching a stopping layer, such as nitride.

In a particular example, polysilicon 32 comprises n-type dopant species, conductive layer 34 comprises tungsten disilicide ($WSi_2$), and stopping layer 36 comprises nitride. Gates 20 and 22 overlie tank 16 and gates 24 and 26 overlie tank 18. Also, contact gate structure 28 overlies at least a portion of field oxide 14 and tank 16, and contact gate structure 30 overlies at least a portion of field oxide 14 and tank 18. It should be noted that contact gate structures 28 do not include stopping layer 36.

To complete the structure shown in FIG. 1A, the process forms source/drain regions 40, 42, 44, and 46 (referred to generally as source/drain regions 40), in a similar manner as tanks 16 and 18. For example, n-type source/drain regions 40 and 42 may be formed by placing a resist over n-type tank 18 and bombarding or implanting phosphorous, arsenic, or other appropriate ions into p-type tank 16. Similarly, p-type source/drain regions 44 and 46 may be formed by placing a resist over p-type tank 16 and bombarding boron or other appropriate ions into n-type tank 18. The process contemplates ion bombardment, ion implantation, solid diffusion, or other appropriate technique to form source/drain regions 40.

Figure 1B:
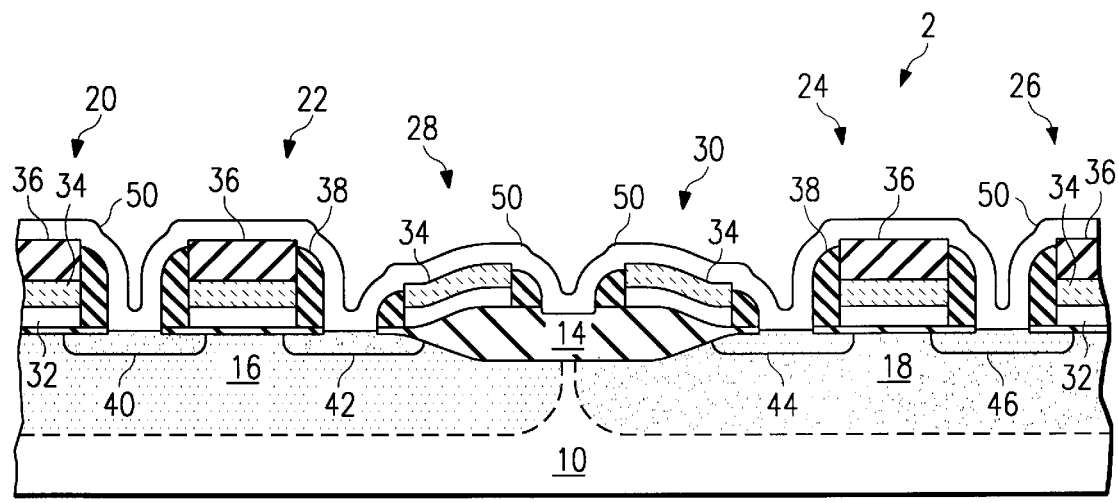

FIG. 1B illustrates a non-doped polysilicon layer 50 formed over field oxide 14, gates 20, contact gate structures 28, and source/drain regions 40. Non-doped polysilicon layer 50 may be deposited using chemical vapor deposition or other appropriate technique. One technical advantage of the present invention is the initial formation of non-doped polysilicon layer 50 without dopant species. As described below, the process then selectively dopes polysilicon layer 50 to form both n-type doped regions and p-type doped regions to accommodate the particular design and function of device 2. The selective doping of regions of polysilicon layer 50 supports CMOS fabrication techniques and offers enhanced flexibility and adaptability of the self-aligned contacts.

Figure 1C:
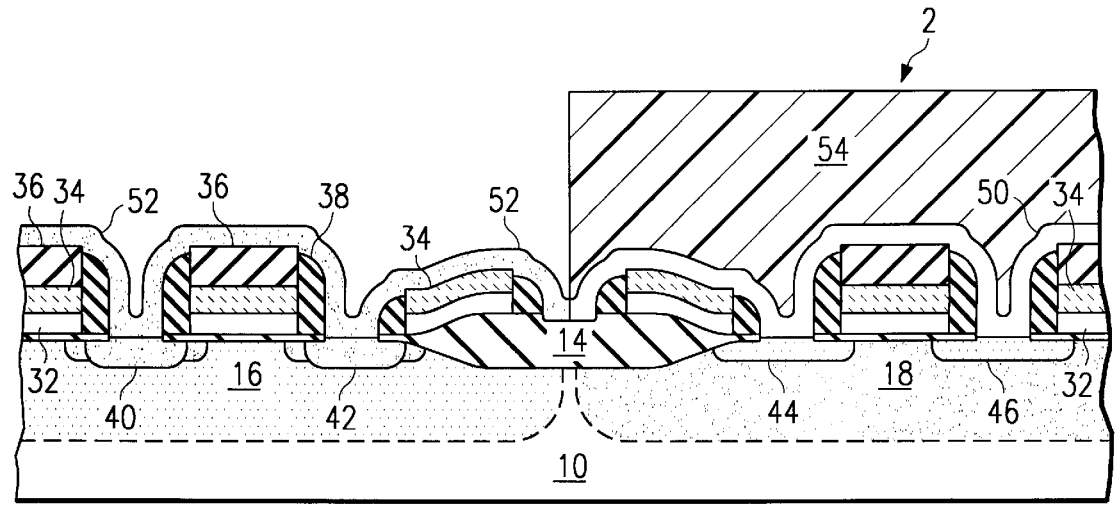
Figure 1D:
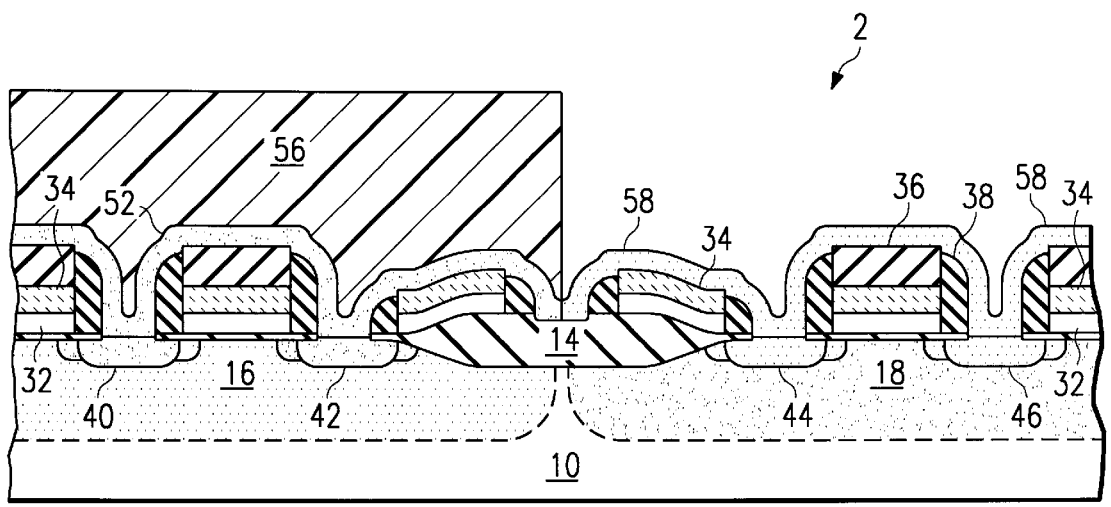

FIG. 1C illustrates the process to form a doped region 52 in non-doped polysilicon layer 50. A patterned resist 54 overlying tank 18 allows selective introduction of suitable dopant species into doped region 52 and source/drain regions 40 and 42. Similarly in FIG. 1D, patterned resist 56 overlying tank 16 allows selective introduction of suitable dopant species into doped region 58 of non-doped polysilicon layer 50 and source/drain regions 44 and 46. For example, an n-type doped region 52 may be formed by bombarding or implanting polysilicon layer 50 with phosphorous, arsenic, or other appropriate ions. Similarly, a p-type doped region 58 may be formed by bombarding or implanting polysilicon layer 50 with boron or other appropriate ions.

During the formation of doped regions 52 and 58, the process also bombards or implants source/drain regions 40 with the dopant species. Non-doped polysilicon layer 50 provides a buffer during the doping processes illustrated in FIGS. 1C and 1D to reduce the depth of source/drain regions 40, which improves peripheral isolation among components in device 2. Also, source/drain regions 40 shown in FIG. 1D comprise overlapping doped regions caused by the initial doping shown in FIG. 1A and subsequent doping shown in FIGS. 1C and 1D. In a particular embodiment, the overlapped doped regions allow greater concentration of the dopant species in source/drain regions 40. After doping non-doped polysilicon layer 50 to form doped regions 52 and 58, the process anneals device 2 to activate the dopant species. In one example, device 2 is heated to 900° C. for ten minutes in a nitrogen ambient to activate the dopant species.

Figure 1E:
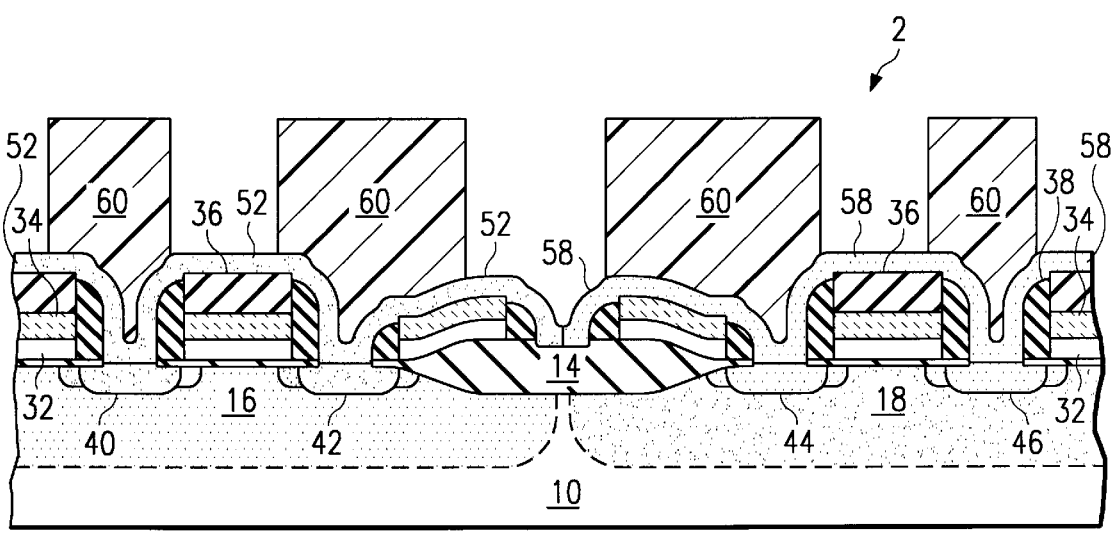
Figure 1F:
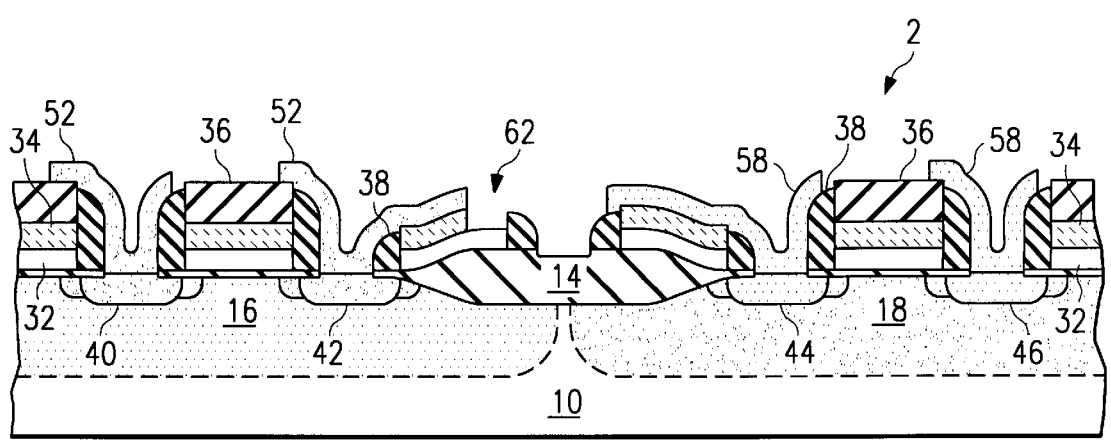

FIGS. 1E and 1F illustrate the patterning of doped regions 52 and 58 of polysilicon layer 50. A patterned resist 60 overlying source/drain regions 40 allows a selective anisotropic etch, such as an oxygen-chlorine etch, to remove portions of doped regions 52 and 58 of polysilicon layer 50. This etching process may remove portions of conductive layer 34, as indicated by region 62.

Figure 1G:
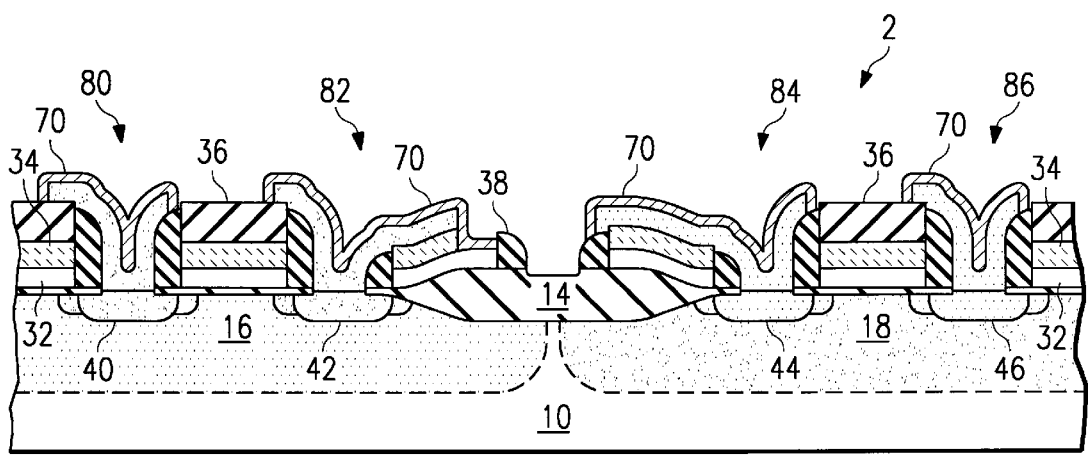

FIG. 1G illustrates a conductive layer 70 formed over doped regions 52 and 58 of polysilicon layer 50. To achieve this, the process forms conductive material, such as titanium, or other appropriate metallic or conductive material, using any conformal, blanket, sputtering or other suitable technique. Next, the process anneals device 2 to promote formation of conductive layer 70 in all areas not contacting nitride or oxide. For example, heating at 580° C. for one hour in a nitrogen ambient causes titanium contacting portions of polysilicon layer 50 to form titanium disilicide ($TiSi_2$). The process then removes the remaining portions of conductive layer that did not transform into a disilicide using an etch, such as hydrofluoric (HF) bath. The resulting structure of device 2 shown in FIG. 1G comprises self-aligned contacts 80, 82, 84, and 86 (referred to generally as contacts 80), coupled to source/drain regions 40, 42, 44, and 46, respectively, in substrate 10.

FIGS. 2A–2G illustrate process steps for forming interconnects to contacts 80. The process begins by forming an oxide layer 100 overlying contacts 80. A stopping layer 102, such as a nitride layer, overlies oxide layer 100. Oxide layer 100, stopping layer 102, or both may be formed using chemical vapor deposition or other appropriate technique, and then planarized using a chemical mechanical polish (CMP) or other appropriate technique.

Figure 2A:
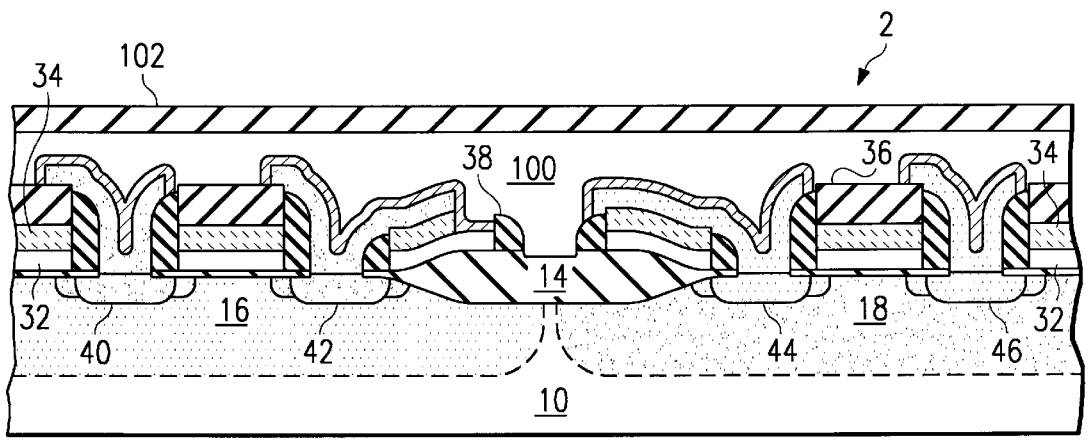
FIGS. 2A–2G illustrate process steps for forming interconnects to the self-aligned contact.
Figure 2B:
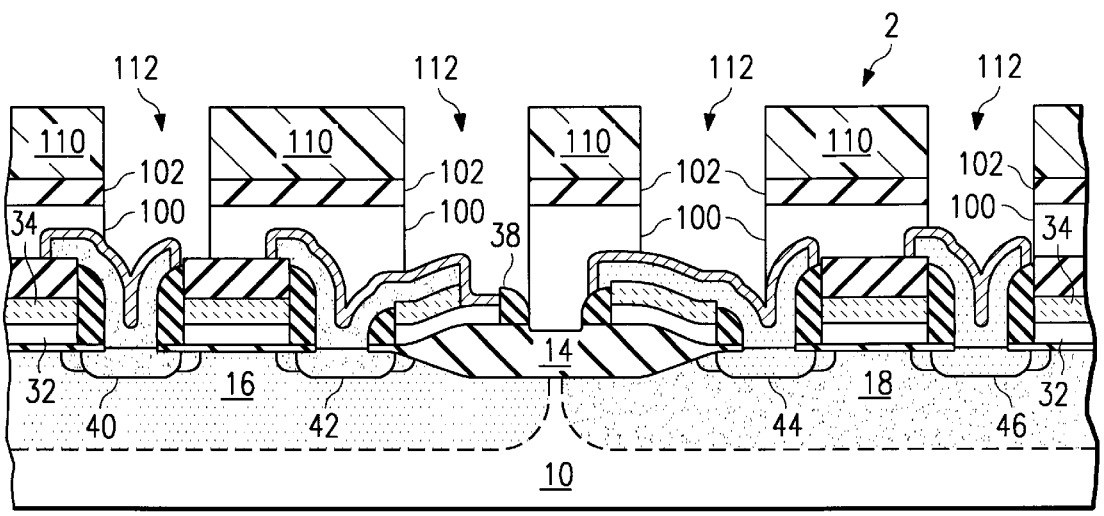

FIG. 2B illustrates patterning of resist 110 to form interconnects to contacts 80. Successive or simultaneous etching of nitride 102 and oxide 100 forms etch regions 112. Depending on the critical dimension dictated by the fabrication equipment, patterning of resist 110 can withstand a certain amount of degradation and alignment margin or tolerance while still forming an interconnect with suitable electrical characteristics. Referring specifically to etched region 112 overlying contact 80, a first portion of etched region 112 terminates on conductive layer 70 and a second portion of etched region 112 terminates on a non-conductive layer, such as stopping layer 36 or sidewalls 38 of gate 22. Therefore, resist 110 may be patterned to form etched region 112 to expose portions of contact 80 and portions of adjacent gates 20 or 22 while still providing an effective contact to source/drain region 40. It should be understood that resist 110 may be patterned to accomplish any particular component design in device 2.

Figure 2C:
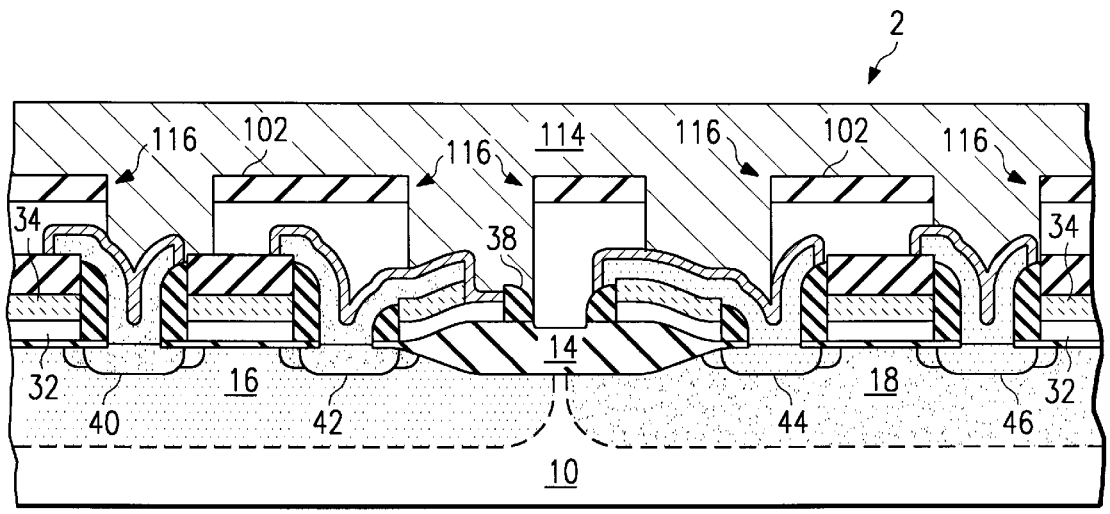
Figure 2D:
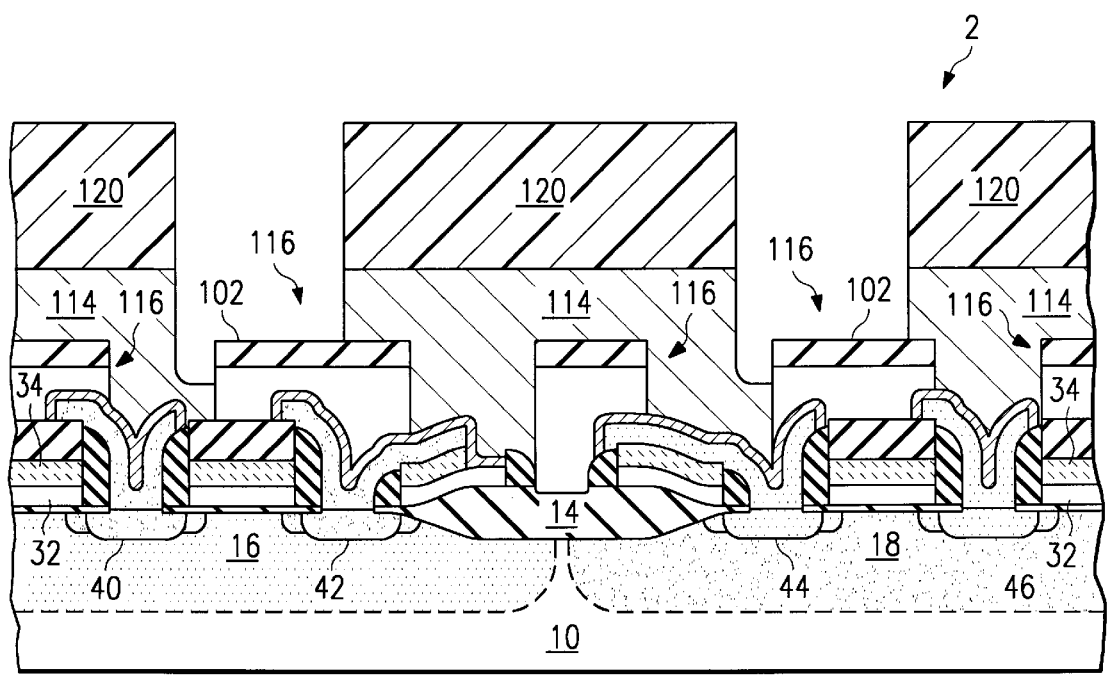

FIG. 2C illustrates device 2 after forming a metal 114, such as aluminum or tungsten, in etched regions 112. Oxide/nitride isolation structures 116, formed above in FIG. 2B, are disposed between contacts 80. A patterned resist 120 shown in FIG. 2D allows etching of selected portions of metal layer 114. In this particular embodiment, the process forms a local interconnect by providing portions of metal layer 114 to electrically couple contacts 82 and 84. It should be understood that resist 120 may be patterned to accomplish any particular component design in device 2.

Figure 2E:
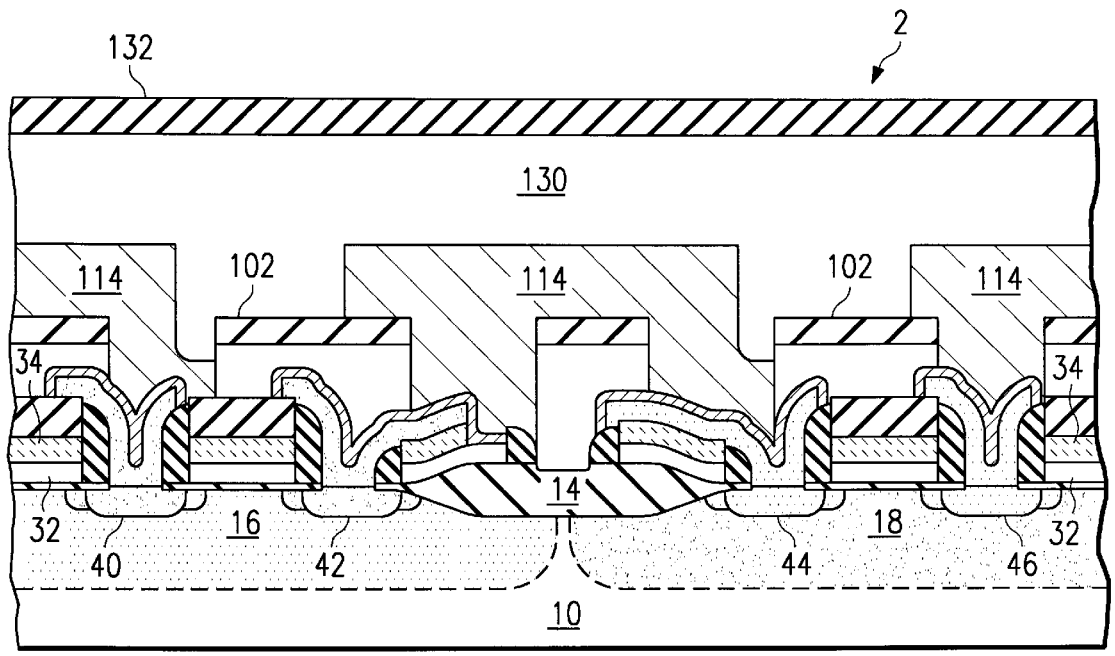
Figure 2F:
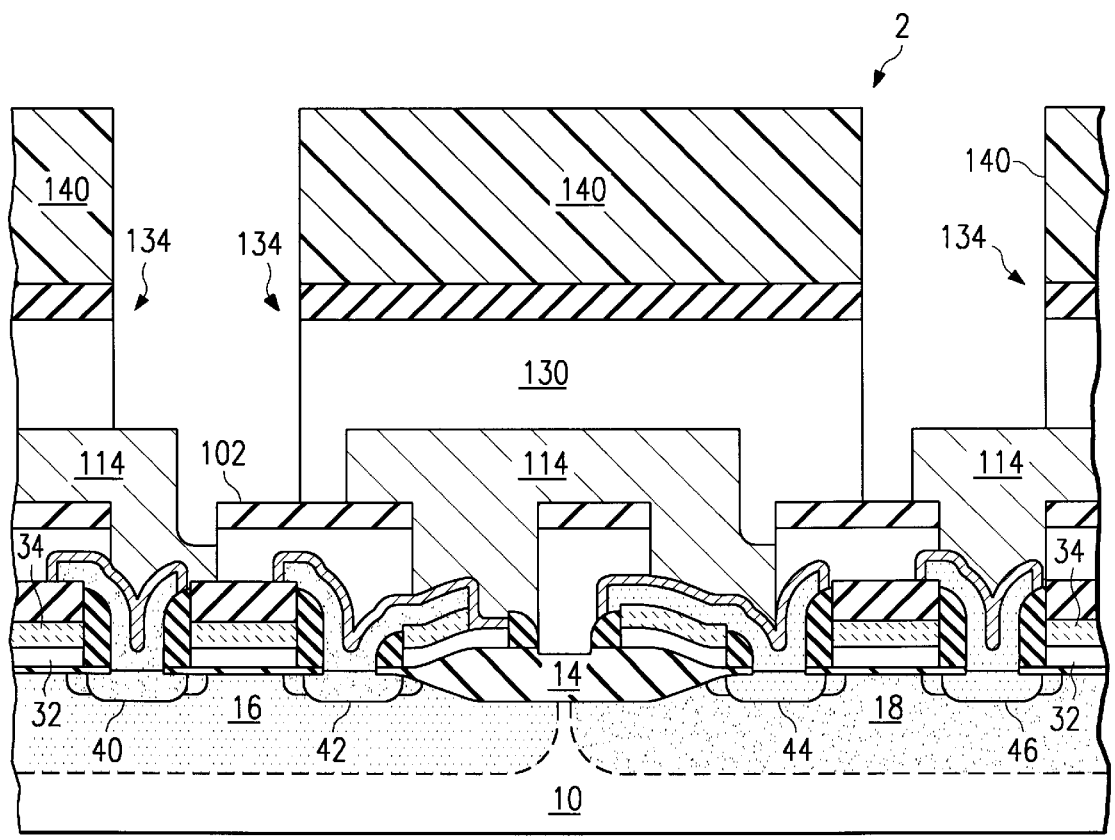

FIG. 2E illustrates similar process steps as FIG. 2A to form another oxide layer 130 and stopping layer 132. As shown in FIG. 2F, a patterned resist 140 allows successive or simultaneous removal of portions of oxide layer 130 and stopping layer 132 to form oxide/nitride isolation structures 134. It should be understood that resist 140 may be patterned to accomplish any particular component design in device 2.

Figure 2G:
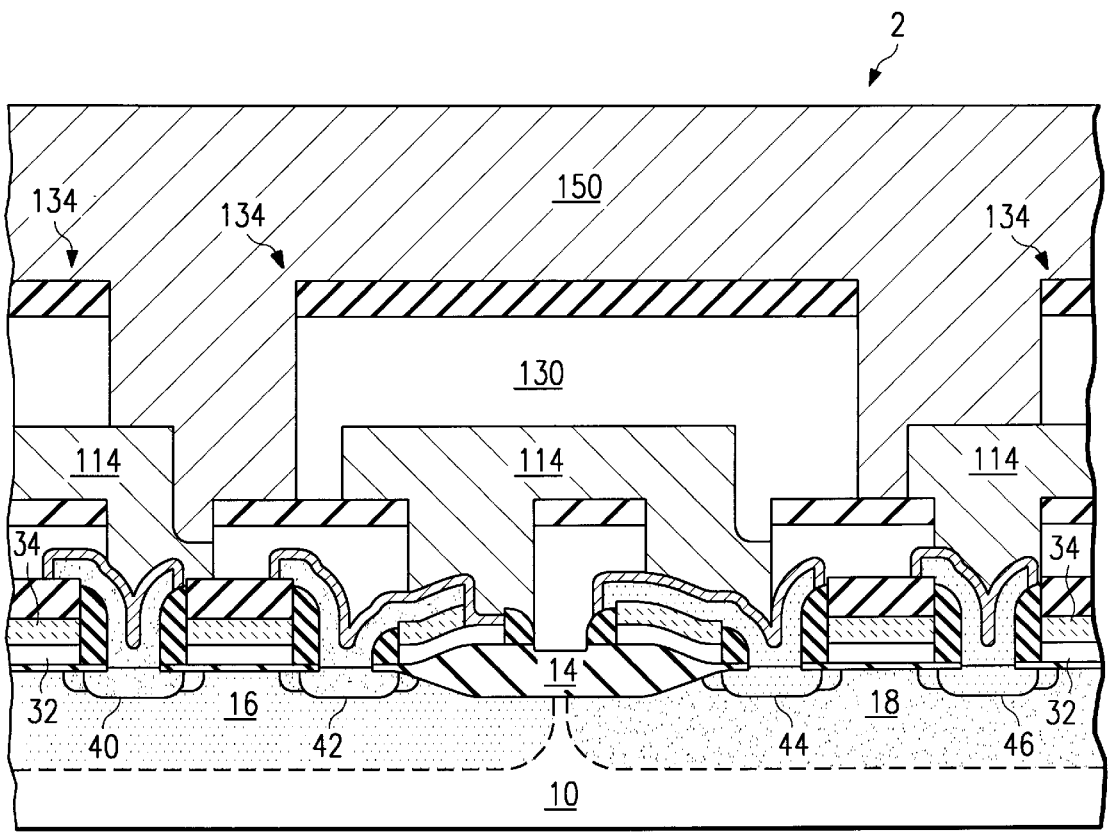

FIG. 2G illustrates device 2 after depositing metal layer 150. However, it should be understood that any number of levels of metal layers and isolation structures may be patterned in any suitable manner to accomplish the design purpose of device 2. In this particular embodiment, metal layer 114 couples source/drain regions 42 and 44 and metal layer 150 couples source/drain regions 40 and 46.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A method for forming a first contact to a substrate between a pair of first gates having sidewall spacers and a second contact to a substrate between a pair of second gates having sidewall spacers, the method comprising:

doping the substrate between the first gates to form a first source/drain region;

doping the substrate between the second gates to form a second source/drain region;

then, forming a polysilicon layer overlying the first gates including the sidewall spacers, the second gates including the sidewall spacers, the first source/drain region, and the second source/drain region, said polysilicon layer being self-aligned to said first gates and said second gates;

doping portions, of the polysilicon layer overlying the first gates and the first source/drain region; and doping portions of the polysilicon layer overlying the second gates and the second source/drain region.

2. The method of claim 1, wherein:

the substrate underlying the first gates comprises p-type dopant species;

the first source/drain region comprises n-type dopant species;

the substrate underlying the second gates comprises n-type dopant species; and the second source/drain region comprises p-type dopant species.

3. The method of claim 1, wherein doping comprises implanting ions.

4. The method of claim 1, wherein the steps of doping the substrate comprise:

masking the second gates;

doping the substrate between the first gates to form the first source/drain region;

masking the first gates; and doping the substrate between the second gates to form the second source/drain region.

5. The method of claim 1, wherein the steps of doping the polysilicon layer comprise:

masking the second gates;

doping portions of the polysilicon layer overlying the first gates and the first source/drain region;

masking the first gates; and doping portions of the polysilicon layer overlying the second gates and the second source/drain region.

6. The method of claim 1, further comprising:

removing portions of the polysilicon layer overlying the first gates and the second gates; and forming a conductive layer overlying the remaining portions of the polysilicon layer.

7. The method of claim 6, wherein the step of forming a conductive layer comprises:

forming a metal layer overlying the polysilicon layer, the first gates, and the second gates;

annealing the metal layer to form the conductive layer where the metal layer contacts the polysilicon layer; and removing portions of the metal layer contacting the first gates and the second gates.

8. The method of claim 7, wherein the metal layer comprises titanium and the conductive layer comprises titanium disilicide.

9. The method of claim 6, further comprising forming a metal layer partially overlying the conductive layer and partially overlying at least one of the first gates.

10. A method of forming a semiconductor device, comprising the steps of:

forming a plurality of gates each having sidewall spacers;

forming a source/drain region between two adjacent gates of said plurality of gates;

then, forming a contact between said two adjacent gates over said source/drain region by:

forming a polysilicon layer over said plurality of gates and said source/drain region, said polysilicon layer being self-aligned to said adjacent gates over said source/drain region and extending along a height of said sidewall spacers for said adjacent gates;

doping at least a portion of said polysilicon layer and the source/drain region; and patterning and etching said polysilicon layer to form at least one contact said contact including a portion of said polysilicon layer extending along a height of said sidewall spacers of said adjacent gates; and forming a metal interconnect layer over said contact wherein said contact provides an electrical connection between said metal interconnect layer and said source/drain region.

11. The method of claim 10, further comprising the steps of:

forming a metal layer over the polysilicon layer; and reacting said metal layer with said polysilicon layer to form a silicide.

* * * * *